(12) United States Patent
van der Weide

(10) Patent No.: US 10,879,911 B2
(45) Date of Patent: Dec. 29, 2020

(54) PHASE DETECTOR WITH ENHANCED SENSITIVITY

(71) Applicant: vdW Design, LLC, Madison, WI (US)

(72) Inventor: Daniel W. van der Weide, Madison, WI (US)

(73) Assignee: vdW Design, LLC, Madison, WI (US)

( * ) Notice: Subject to any disclaimer, the term of this patent is extended or adjusted under 35 U.S.C. 154(b) by 0 days.

(21) Appl. No.: 16/748,760

(22) Filed: Jan. 21, 2020

(65) Prior Publication Data
US 2020/0235743 A1 Jul. 23, 2020

Related U.S. Application Data

(60) Provisional application No. 62/794,172, filed on Jan. 18, 2019.

(51) Int. Cl.
| H03D 3/24 | (2006.01) |
| H03L 7/087 | (2006.01) |
| H03L 7/097 | (2006.01) |
| H03L 7/091 | (2006.01) |

(52) U.S. Cl.
CPC .............. *H03L 7/087* (2013.01); *H03L 7/091* (2013.01); *H03L 7/097* (2013.01)

(58) Field of Classification Search
CPC ......... H03L 7/087; H03L 7/097; H03L 7/091; H03L 7/20; G02F 1/011; G03F 7/00; H04B 3/04; H04L 1/206; G01R 35/005; G01R 31/2825; H03K 3/80; H04R 3/04; H04R 29/004

USPC .................................................. 375/375, 377
See application file for complete search history.

(56) References Cited

U.S. PATENT DOCUMENTS

| 4,566,100 | A | * | 1/1986 | Mizuno | H04L 1/206 375/280 |
| 8,693,893 | B2 | * | 4/2014 | Johnson | G02F 1/011 398/183 |
| 10,634,757 | B1 | * | 4/2020 | Martens | G01R 35/005 |
| 2005/0270091 | A1 | * | 12/2005 | Kozyrev | H03F 7/00 330/4.5 |
| 2006/0125572 | A1 | * | 6/2006 | van der Weide | H04B 3/04 333/20 |
| 2010/0141269 | A1 | * | 6/2010 | Quan | G01R 31/2825 324/622 |
| 2012/0154894 | A1 | * | 6/2012 | Johnson | G02F 1/011 359/279 |
| 2015/0035614 | A1 | * | 2/2015 | Seddon | H03K 3/80 333/20 |
| 2016/0252567 | A1 | * | 9/2016 | Quan | H04R 29/004 702/69 |
| 2018/0332415 | A1 | * | 11/2018 | Quan | H04R 3/04 |
| 2019/0140653 | A1 | * | 5/2019 | Tong | H03L 7/20 |

* cited by examiner

*Primary Examiner* — Phuong Phu
(74) *Attorney, Agent, or Firm* — Casimir Jones, S.C.; David W. Staple

(57) ABSTRACT

A phase detector using nonlinearities to distort and compress waveforms of the reference and the unknown sources. This waveform distortion creates a region of phase in which the slew rate is greater than that of the input sinusoid, enabling a larger phase detector constant.

15 Claims, 7 Drawing Sheets

PHASE DETECTOR WITH ENHANCED SENSITIVITY

CROSS-REFERENCE TO RELATED APPLICATION

The present application claims priority to U.S. Provisional Patent Application Ser. No. 62/794,172, filed Jan. 18, 2019, which are hereby incorporated by reference in its entirety.

FIELD

The present invention is in the field of phase detectors or comparators. More particularly, the present invention is in the technical field of microwave, millimeter-wave, terahertz (THz) and optical phase detectors.

BACKGROUND

Phase detectors, comparators or discriminators all perform the basic function of comparing a reference phase to an unknown phase. The phase difference between the reference and the unknown is the output or error signal, which is commonly used to control or correct the unknown phase. Phase detectors are employed in phase-locked loops (PLLs) to impart the phase or frequency stability of a reference oscillator onto another oscillator, often operating at a higher frequency. The ability to control or discipline a higher-frequency oscillator so that its phase or frequency takes on the stability characteristics of the lower-frequency reference also enables tuning of the high frequency oscillator if, for example, the reference consists of a counter that can be set to different values.

At radio frequencies, phase detection is typically performed with multipliers or mixers for any application that requires phase information [S. R. Kurtz, "Mixers as Phase Detectors," WJ Commun. Inc., 2001]. Digital [S. Jablonski, K. Czuba, F. Ludwig, and H. Schlarb, "$2\pi$ Low Drift Phase Detector for High-Precision Measurements," IEEE Trans. Nucl. Sci., vol. 62, no. 3, pp. 1142-1148, June 2015] and even mechanical [Hao Yan, Xiaoping Liao, and Di Hua, "The phase sensitivity and response time of an X-band dual channel microwave phase detector," in IEEE SENSORS, 2015, pp. 1-4] techniques can also provide phase detection.

Low-frequency phase references are often frequency-multiplied via nonlinearities to provide a harmonic commensurate with the sinusoidal output of the high-frequency oscillator to be controlled. One example uses step-recovery diodes (SRDs) in voltage-controlled oscillator (VCO) phase locking, with applications in communications and radar [Skyworks, "Theory and Application of Sampling Phase Detectors." pp. 1-7, 2008]. Thus, even when a nonlinearity is present in a phase detector or discriminator, phase comparisons are done between two sinusoids, one of which is a harmonic of a low-frequency reference.

SUMMARY

In contrast to the prior art, the present invention uses nonlinearities in both the reference and unknown channels. This provides significantly enhanced phase sensitivity over prior-art phase detectors, enabling improved control over the unknown phase or frequency.

In particular, the present invention applies substantially similar nonlinearities to the sinusoidal outputs of both reference and unknown sources, transforming these outputs to sawtooth or step-like waveforms with regions having enhanced slew rates, i.e. change in voltage vs. time. The invention uses a conventional sampling gate, switch, or any other comparable circuit, driven by the reference waveform, to sample the voltage of the unknown waveform and provide an instantaneous representation of the unknown waveform's voltage. If the two waveforms are identical in shape and arrive at the sampler at the same instant in time (i.e. they have the same phase), the output of the sampler indicates minimum difference between the waveforms. Due to the enhanced slew rates of the waveforms, however, a small phase offset between them results in a much larger voltage change in the output of the sampler than one of skill observes using prior-art techniques.

In some embodiments, provided herein are phase detectors using nonlinearities to distort the waveforms of the reference and the unknown sources. In some embodiments, the non-linearities are substantially similar. In some embodiments, provided herein are phase detectors using a first nonlinearity in a reference source and a second nonlinearity in an unknown source to distort waveforms of the reference and the unknown sources. In some embodiments, the first nonlinearity and the second nonlinearity are substantially similar. In some embodiments, the first nonlinearity is applied to a first sinusoidal output from the reference source, and the second nonlinearity is applied to a second sinusoidal output from the unknown source. In some embodiments, the first and second sinusoidal outputs are transformed to sawtooth or step-like waveforms with regions having enhanced slew rates. In some embodiments, phase detectors further comprise a conventional sampling gate or switch, driven by the reference waveform, to sample a voltage of the unknown waveform. In some embodiments, phase detectors further comprise a conventional sampling gate or switch, driven by the first input sinusoidal waveform, to sample a voltage of the second input sinusoidal waveform. In some embodiments, phase detectors further comprise a conventional sampling gate or switch, driven by the first distorted waveform, to sample a voltage of the second distorted waveform.

In some embodiments, provided herein are phase detector devices comprising: (a) a reference source configured to produce a first input sinusoidal waveform; (b) a first non-linear transmission line (NLTL) operably connected to the reference source and configured to distort the first input sinusoidal waveform to produce a first distorted waveform comprising an edge with greater slew rate than the first input sinusoidal waveform; (c) a sample source configured to produce a second input sinusoidal waveform; (d) a second NLTL operably connected to the sample source and configured to distort the second input sinusoidal waveform to produce a second distorted waveform comprising an edge with greater slew rate than the second input sinusoidal waveform; (e) a sampler operably linked to the first NLTL and the second NLTL and configured to receive the first and second distorted waveforms and to produce and output that is indicative of the relative difference or error between phases of the reference source and the sample source. In some embodiments, the first NLTL comprises a variable delay or phase line. In some embodiments, the first NLTL and second NLTL are substantially similar. In some embodiments, the sample source is an unknown source. In some embodiments, the first and second distorted waveforms are sawtooth or step-like waveforms with regions having enhanced slew rates. In some embodiments, devices further comprise a conventional sampling gate or switch, driven by the reference waveform, to sample a voltage of the sample waveform. In some embodiments, the first and second distorted waveforms have a rising and/or falling edge with a maximum slope of greater than 1 volts/nanosecond (e.g., 2V/ns, 5V/ns, 10V/ns, 20V/ns, 50V/ns, 100V/ns, 200V/ns, 500V/ns, 1V/picosecond, 2V/ps, 5V/ps, 10V/ps, or more, or ranges therebetween).

In some embodiments, provided herein are methods comprising: (a) applying a first nonlinearity to a first input sinusoidal waveform from a reference source to obtain a first distorted waveform comprising an edge with greater slew rate than the first input sinusoidal waveform; (b) applying a second nonlinearity to a second input sinusoidal waveform from a sample source to obtain a second distorted waveform comprising an edge with greater slew rate than the second input sinusoidal waveform; and (c) feeding the first and second distorted waveforms into a sampler to produce an output that is indicative of the relative difference or error between phases of the reference source and the sample source. In some embodiments, the first and second distorted waveforms are sawtooth or step-like waveforms with regions having enhanced slew rates. In some embodiments, the first and second distorted waveforms have a rising and/or falling edge with a maximum slope of greater than 1 volts/nanosecond (e.g., 2V/ns, 5V/ns, 10V/ns, 20V/ns, 50V/ns, 100V/ns, 200V/ns, 500V/ns, 1V/picosecond, 2V/ps, 5V/ps, 10V/ps, or more, or ranges therebetween).

BRIEF DESCRIPTION OF THE DRAWINGS

FIG. 1. Materials under test (left) are placed in the beam path of the propagating pulse (center), causing a shift in the sampling aperture tracking the pulse slope (right).

DETAILED DESCRIPTION OF THE INVENTION

Figure 1:
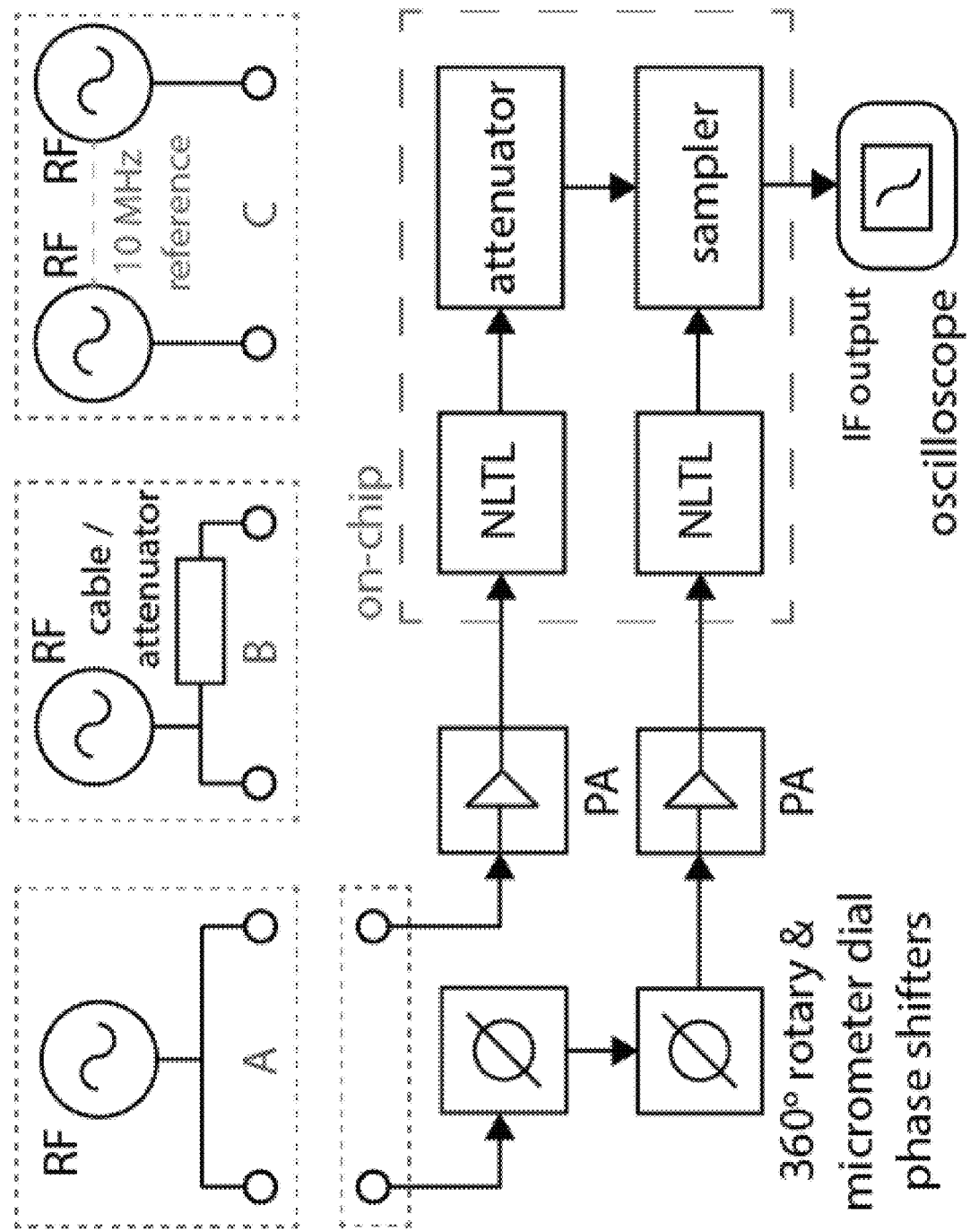
FIG. 1. The NLTL experiment setup for detecting ultrafast transients generated from microwave sources was modified with three source configurations. For phase detection experiments, these configurations were (A) a single synthesizer, (B) a single synthesizer with delayed or attenuated arm, and (C) dual phase-locked synthesizers.

The present invention is in the field of phase detectors or comparators. More particularly, the present invention is in the technical field of microwave, millimeter-wave, terahertz (THz) and optical phase detectors. Provided herein are phase detectors using nonlinearities to distort and compress waveforms of the reference and the unknown sources. This waveform distortion creates a region of phase in which the slew rate is greater than that of the input sinusoid, enabling a larger phase detector constant.

Phase detectors are essential for phase-locked loops, synthesizing stable micro- and millimeter-wave frequencies, and measuring phase noise. Provided herein is a phase detector built around a self-sampling nonlinear transmission line transient generator integrated circuit that trades capture range for high phase sensitivity, for example, observing 4.4 V/rad at 9 GHz. In some embodiments, the phase detector constant is increased (e.g., doubled) by reducing the on-chip attenuation and utilizing the full range of the on-chip sampler.

Nonlinear transmission lines (NLTLs) have found use in numerous applications, ranging from test and measurement equipment to low phase noise frequency generation [J. Breitbarth, "Design and Characterization of Low Phase Noise Microwave Circuits," University of Colorado, 2006.]. They produce high slew rate edges from microwave drive signals with low phase noise. NLTL self-test circuits can measure these fast-changing edges [M. Dwyer, H. Kim, L. Mawst, and D. van der Weide, "Double-uniform Schottky diode nonlinear transmission line generating sub-picosecond transients," in 2018 IEEE Radio and Wireless Symposium (RWS), 2018, pp. 287-289.], but are susceptible to phase noise in the driving microwaving signals, leading to measurement uncertainty. This sensitivity to phase deviation between two driving microwave sources can be exploited for phase detection.

Phase detection is typically performed with mixers, in any application that requires phase information [S. R. Kurtz, "Mixers as Phase Detectors," *WJ Commun. Inc.*, 2001.]. Digital [S. Jablonski, K. Czuba, F. Ludwig, and H. Schlarb, "2π Low Drift Phase Detector for High-Precision Measurements," *IEEE Trans. Nucl. Sci.*, vol. 62, no. 3, pp. 1142-1148, June 2015.] and MEMS [Hao Yan, Xiaoping Liao, and Di Hua, "The phase sensitivity and response time of an X-band dual channel microwave phase detector," in 2015 *IEEE SENSORS*, 2015, pp. 1-4.] techniques can also provide phase detection. Step recovery diodes can also be used, such as in voltage-controlled oscillator phase locking, with applications in communications and radar. [Skyworks, "Theory and Application of Sampling Phase Detector." pp. 1-7, 2008.]

Ultrafast NLTLs are driven with continuous wave microwave signals and sharpen the leading negative edge to produce an ultrafast transient on the order of 1 picosecond. On a self-test circuit, one NLTL output is attenuated and sampled, while the other NLTL output is differentiated and strobed across a sampling bridge. If there is a frequency offset between the two signals driving each NLTL, the strobed sampling bridge will sample the whole waveform under test, repeating at a rate of the frequency offset. If the drive frequencies are the same, the whole waveform will be captured if one source is phase shifted from 0° to 360° offset relative to the other source, as with a rotary waveguide phase shifter.

NLTLs add significantly less phase noise compared with the related step recovery diode pulse generator [J. Breitbarth, "Design and Characterization of Low Phase Noise Microwave Circuits," University of Colorado, 2006.]. By sharpening the waveform edge with low phase noise, the NLTL provides amplified phase detection around the midpoint of the transient. This transient, on the order of a picosecond, corresponds to a phase amplified region covering 2 to 4

TABLE 1

PHASE DEVIATION MEASUREMENTS WITH VARIOUS EXPERIMENT CONFIGURATIONS

| Frequency (GHz) | Synthesizer | Configuration | Voltage deviation | | Phase deviation | |
|---|---|---|---|---|---|---|
| | | | mV-RMS | mV-pk | °-RMS | °-pk |
| 9 | Single | A: Noise floor (power only to sampler) | 1.4 | 11.0 | 0.017 | 0.143 |
| 9 | Single | A | 1.9 | 13.5 | 0.024 | 0.175 |
| 10 | Single | A | 1.9 | 8.6 | 0.045 | 0.205 |
| 11 | Single | A | 1.7 | 7.9 | 0.057 | 0.264 |
| 12 | Single | A | 1.7 | 8.3 | 0.026 | 0.123 |
| 9 | Single | B: 18 ft cable on drive RF | 2.3 | 12.8 | 0.030 | 0.165 |
| 9 | Single | B: 2 × 18 ft cables on drive RF | 2.5 | 11.9 | 0.032 | 0.154 |
| 9 | Single | B: Attenuator equivalent to 36 ft cable loss on RF | 1.8 | 8.6 | 0.024 | 0.111 |
| 9 | Dual | C: 50 GHz & 26.5 GHz synthesizers, phase locked | 53.1 | 136.7 | 0.737 | 2.666 | degrees at X band.

FIG. 1 depicts the setup used in some experiments herein which is similar to that described in [M. Dwyer, H. Kim, L. Mawst, and D. van der Weide, "Double-uniform Schottky diode nonlinear transmission line generating sub-picosecond transients," in 2018 IEEE Radio and Wireless Symposium (RWS), 2018, pp. 287-289], but with an additional precise micrometer dial phase shifter, and varying synthesizer configurations (denoted A, B, and C), as shown in FIG. 1. The micrometer phase shifter enabled the precise alignment of two waveforms, while the mechanized rotary phase shifter could sweep through the whole waveform. All single oscillator configurations used a HP 83630A 26.5 GHz synthesizer with a power splitter.

Phase Detection at Discrete Frequencies

Figure 2:
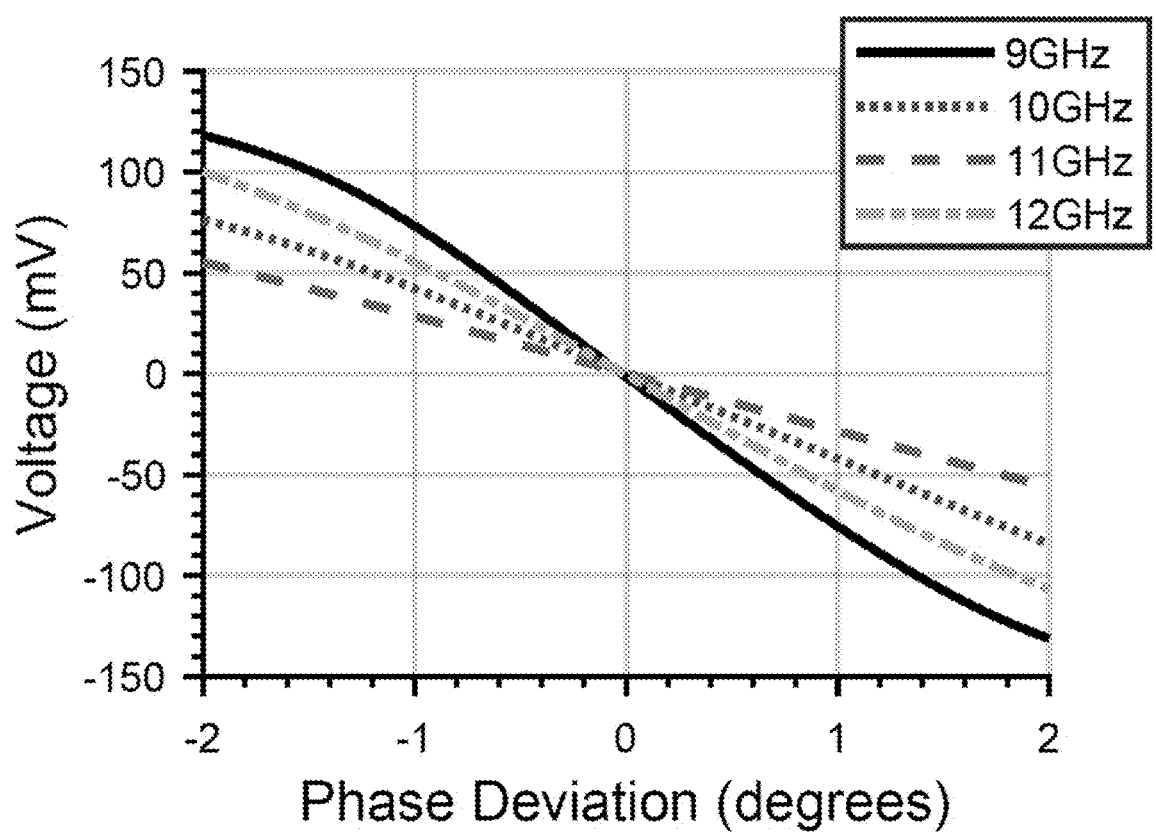
FIG. 2. Phase detector response curve mapped from sampled NLTL transient waveforms.

Full NLTL transient waveform was captured using configuration A by rotating through the 360° phase shifter at discrete frequencies of interest, with RF power of around 30 dBm chosen to give a moderate −3 V rectified bias. Similar results are achieved with reduced power using NLTLs with tailored capacitance-voltage curves. Resonant circuit effects prevented driving the NLTL at 8 GHz, and waveguide components limited higher frequencies. The time base was mapped to degrees for each frequency and centered on the transient midpoint of each waveform (FIG. 2). The transient midpoint was also shifted to 0 mV.

Figure 3:
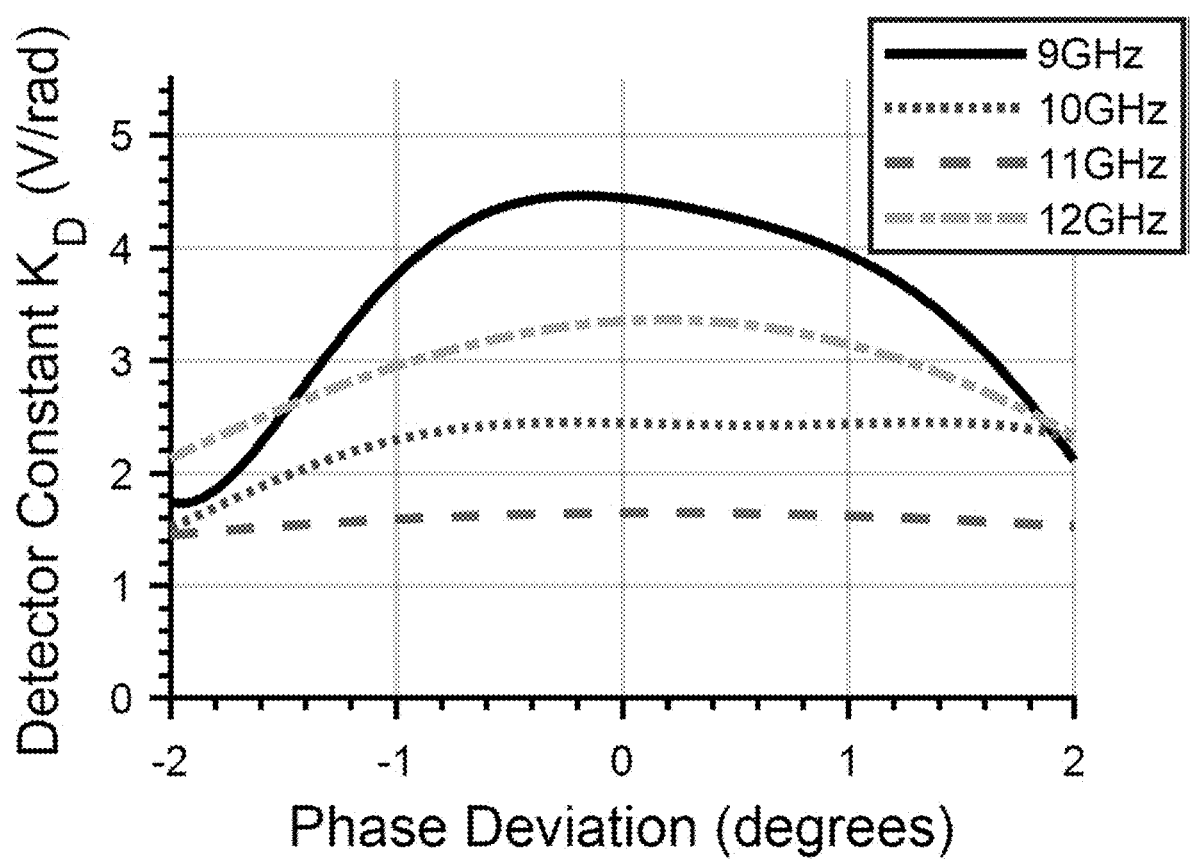
FIG. 3. Phase detector constant curve derived from FIG. 2.

The transient section of the waveform was differentiated to give the phase detector constant $K_D$ (V/rad). The optimal drive frequency of 9 GHz, generating a sub-picosecond transient, provided the highest sensitivity (FIG. 3), and was hence used for testing in the other experiment configurations. The transients at 10 and 11 GHz exhibited slower falltimes, contributing to reduced $K_D$, but wider phase deviation range. The 12 GHz transient was similar in falltime to the optimal 9 GHz waveform, but the reduced period translated to a lower $K_D$. It should be noted that magnitude of the sampled transient was heavily attenuated, and any reduction in attenuation would correspondingly increase the phase detector constant. With an attenuator reduction of 6 dB, $K_D$ would double. Reducing attenuation much beyond 6 dB would risk the waveform under test triggering the sampling diodes.

The noise floor of the experiment was measured by driving the NLTL sampling bridge with the other NLTL output heavily attenuated. The results of all experiments in this work are tabulated in Table 1. The high noise floor was a result of the unshielded multi-pin DC probe used to extract the down-converted waveform. Experiments on other NLTL designs configured for shielded sampler probing reduced the noise floor by almost an order of magnitude.

Adding Delay and Attenuation to One Drive

The short-term stability of an oscillator is evaluated by splitting the output into the two ports of a phase detector, with one arm delayed with a long length of cable. With configuration B, one and then two cables were added to the delay arm, and then replaced the cables with an attenuator of similar insertion loss to require similar synthesizer power without the cable delay. 18 feet long UTiFlex UFB311A cables were used, giving approximately 21 ns propagation delay and 4 dB loss per cable. Adding one cable increased the RMS phase deviation by 25%, and two cables increased by 33%. The attenuator in place of the cables gave RMS phase deviation similar to configuration A, ruling out increased synthesizer power as the source of increased phase deviation, rather than temporal stability.

Phase Locked Dual-Synthesizers

Two phase locked synthesizers are the traditional configuration for driving NLTLs. The phase deviation with synthesizers herein was incompatible with high-speed measurements, choosing instead the rotating phase shifter. In configuration C, significant phase deviation was observed, with peak deviation exceeding 2 degrees. At 9 GHz, a sub-picosecond transient covers around 3 degrees, so this level of deviation prevents stable, repeatable measurements. The phase locked 20 GHz HP 83620A synthesizer generated a waveform offset from the other synthesizer by a fraction of a hertz.

Mixer Comparison

A Marki M10212 mixer was used to evaluate the two synthesizers in configurations A and C. Power levels were optimized to increase the phase detector constant, with total voltage swing exceeding the NLTL based system, but over a much larger phase range. We measured a $K_D$ of around 0.14 V/rad, but with a much lower noise floor over the probed NLTL. The mixer was able to measure the phase variation between the two synthesizers in configuration C, but was not able to detect a measurable phase variation above the noise floor for the single synthesizer in configuration. The $K_D$ of this mixer, and other, phase detector specific, mixers are compared Table 2.

TABLE 2

PEAK PHASE DETECTOR CONSTANT

| Detector | Freq. (GHz) | $K_D$ (V/rad) |
|---|---|---|
| NLTL (this work) | 9 | 4.4 |
| NLTL (this work) | 10 | 2.4 |
| NLTL (this work) | 11 | 1.7 |

TABLE 2-continued

PEAK PHASE DETECTOR CONSTANT

| Detector | Freq. (GHz) | $K_D$ (V/rad) |
|---|---|---|
| NLTL (this work) | 12 | 3.3 |
| Marki M10212 | 9 | 0.14 |
| Holzworth HX3400 | 1-6 | 0.3 [7] |
| AD HMC3716LP4E | 0.01-1.3 | 0.32 [8] |

Ultrafast NLTLs have been used to detect phase deviation between two signals of equivalent frequency, with phase detector constants up to 14 times higher than commercial mixer-based detectors over a narrow phase range. Small phase changes in two phase-aligned waveforms translated to large voltage outputs due to the high slew rate of the transient waveform and correspondingly large phase detector constant KD. This technique was used to evaluate synthesizer temporal and phase-lock stability. These phase constants could be doubled by reducing the on-chip waveform-under-test attenuation by 6 dB, while still falling within the sampler detection range. With shielded probing or careful device packaging, the noise floor is significantly reduced, increasing overall sensitivity.

Figure 4:
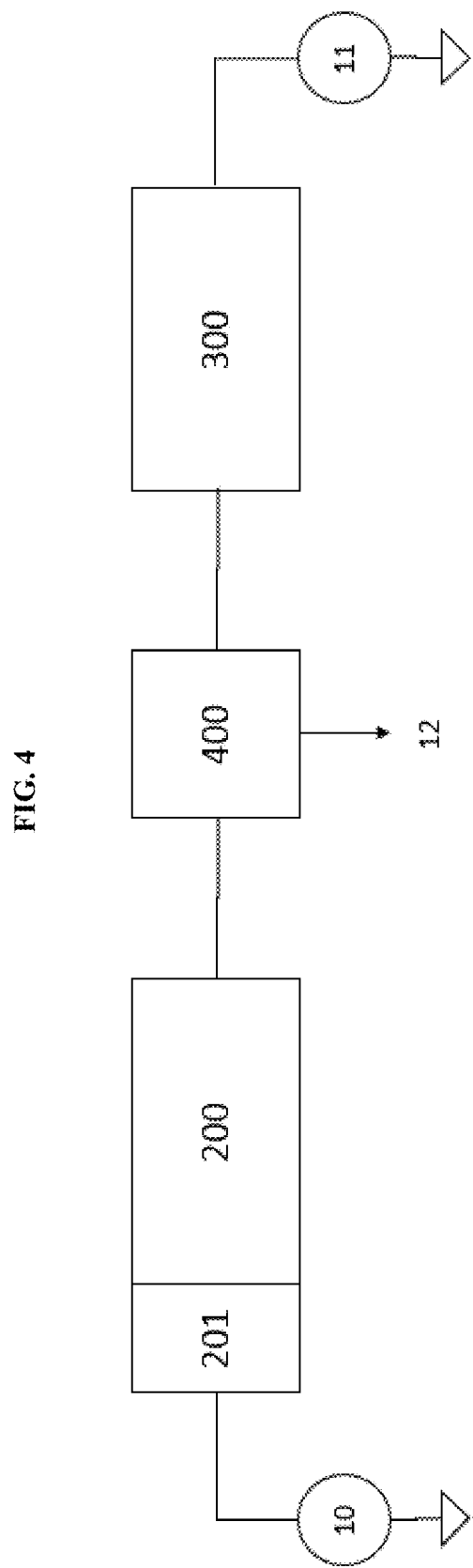
FIG. 4. Block diagram of exemplary embodiment of the present invention.

FIG. 4 provides a block diagram of an exemplary system herein. A reference source 10 feeds a nonlinearity 200, which has in series a variable delay or phase line 201 to provide alignment between the phases of the reference and the unknown source 11. The unknown source 11 itself feeds a nonlinearity 300 substantially similar to that of 200. The outputs of each nonlinearity—generally a sawtooth waveform with a fast rising or falling edge (i.e. an edge with greater slew rate than that of the input sinusoid)—are fed into a sampler 400 whose output 12 is indicative of the relative difference or error between the phases of the reference 10 and the unknown 11. The nonlinearities 200 and 300 can be realized with nonlinear transmission lines (NLTLs) known in the art, for example, D. W. van der Weide "Delta-doped Schottky diode nonlinear transmission lines for 480-fs, 3.5-V transients," Applied Physics Letters 65 (7), 881-883 (1994), incorporated herein by reference. This publication also includes references to other NLTL designs and diode sampler designs known in the art and applicable to the present invention.

Experiments were conducted on the invention as exemplified in FIG. 4. These are summarized in Table 3 below.

TABLE 3

| Detector | Freq. (GHz) | $K_D$ (V/rad) |
|---|---|---|
| Present invention | 9 | 4.4 |
| Present invention | 10 | 2.4 |
| Present invention | 11 | 1.7 |
| Present invention | 12 | 3.3 |
| Marki M10212 | 9 | 0.14 |
| Holzworth HX3400 | 1-6 | 0.3 |
| AD HMC3716LP4E | 0.01-1.3 | 0.32 |

For comparison to the present invention, a prior-art Marki M10212 frequency mixer was used to evaluate the phase difference between two HP 83630A 26.5 GHz synthesizers. Power levels were optimized to increase the phase detector constant, with total voltage swing exceeding the NLTL based system, but over a much larger phase range. A phase detector constant $K_D$ of 0.14 V/rad was measured. Results from this and two other, phase detector specific mixers (Holzworth Instrumentation, "MODEL HX3400 Datasheet" 2018 and Analog Devices, "HMC3716LP4E Datasheet" 2018) are compared with those of the present invention in Table I.

The advantages of the present invention include, without limitation, a phase detector constant ~10× larger than that of the prior art.

In broad embodiment, the present invention enables higher sensitivity phase detection than the prior art, albeit over a more limited capture range. One of skill understands how to adjust or trim the phase or delay of the reference (as shown, for example in FIG. 4 element 201) in order to match that of the reference. This delay trim can be accomplished by lengths of transmission line, mechanical or electronic phase shifters, or (in the case of free space transmission) changing the spacing of optical elements in the beam path.

Example 1

Millimeter-Wave Thickness Deviation Measurement System

Experiments were conducted during development of embodiments herein to measure dielectric slab thickness deviations on the order of tens of microns using a free-space radiating pulse generation and detection system comprised of Xband driven nonlinear transmission line integrated circuits coupled to bow-tie antennas. This is achieved by locking the receiver sampling aperture to the midpoint of a pulse transmitted through the reference material, and then replacing with the material under test to observe a deviation in thickness from the reference. A change in thickness causes the sampling aperture to move along the pulse slope, giving a corresponding change in DC voltage.

Figure 5:
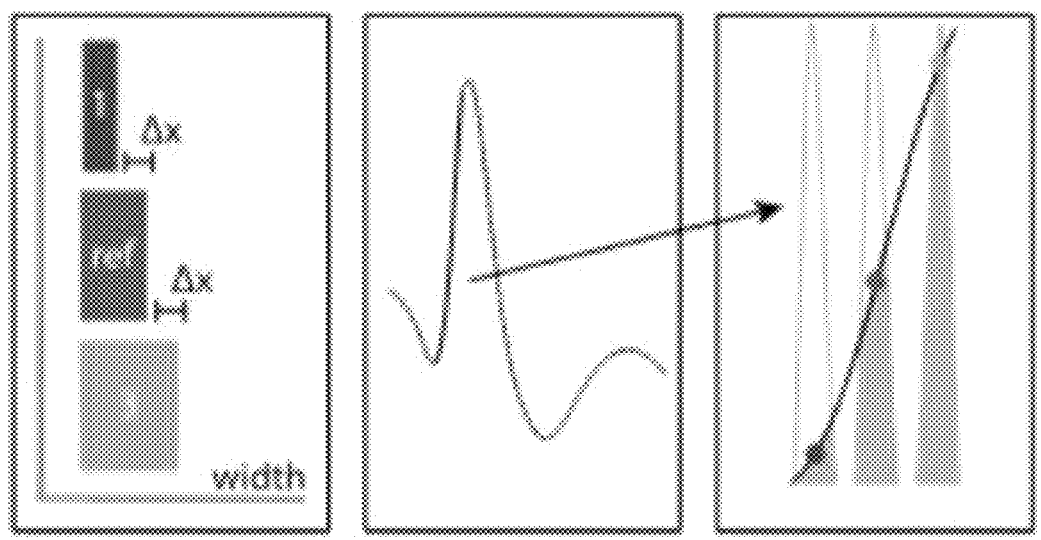
FIG. 5.
Figure 6:
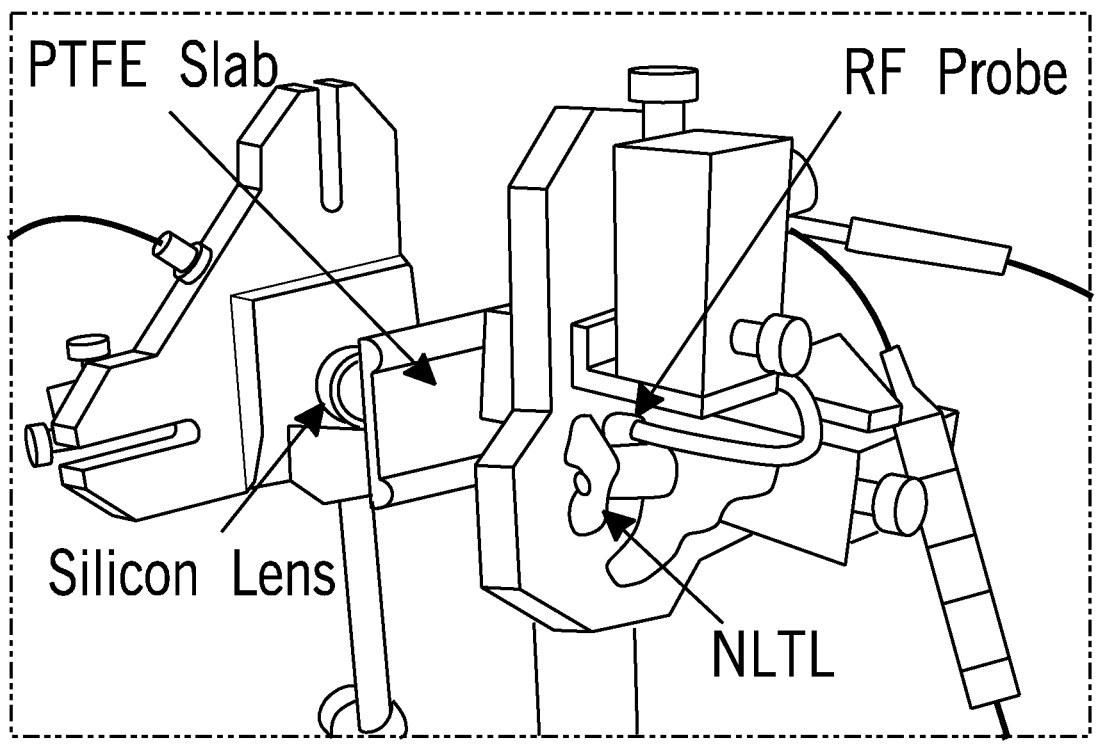
FIG. 6. PTFE measurement sample located in the beam path of the free-space radiating NLTL setup.
Figure 7:
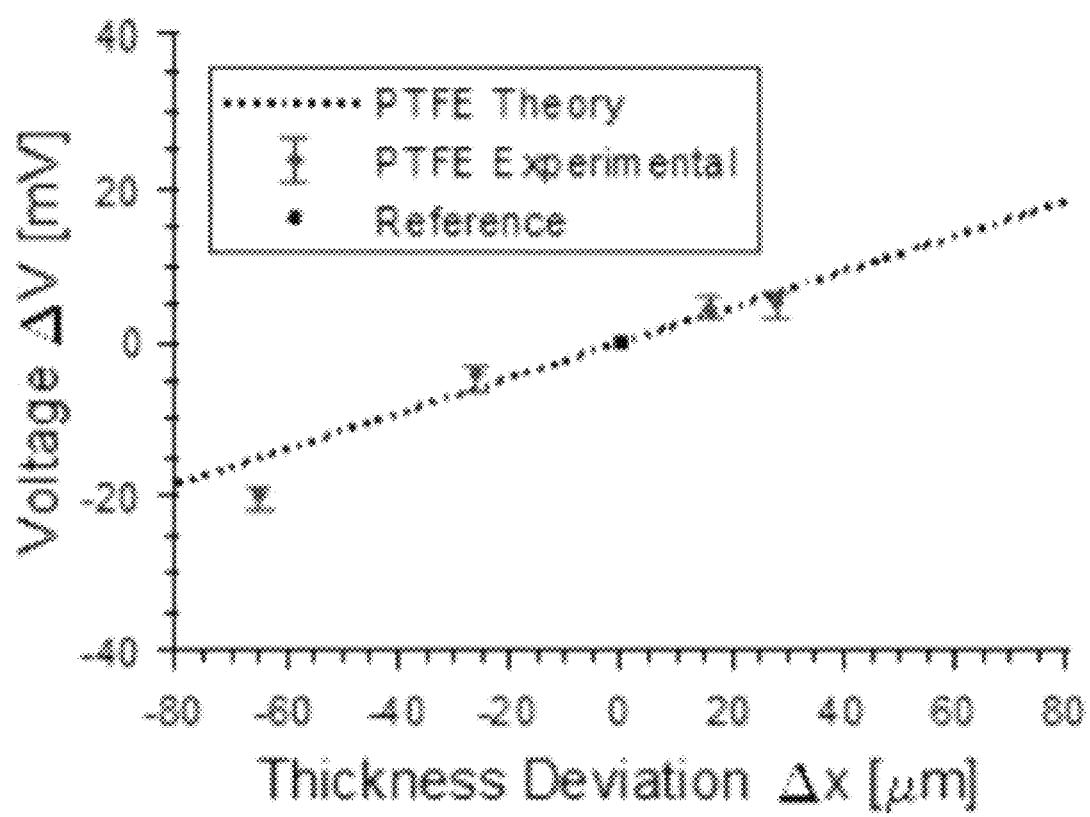
FIG. 7. Relationship between theoretically predicted and experimentally verified thickness of PTFE, measured by radiating an NLTL transient through a sample placed in the free-space beam path. Figure depicts 500 measurements.

The Experimental setup and results are depicted in FIGS. 5-7.

A sweep sampler was used to capture compete waveforms. Micrometer-adjusting phase shifter locates the steepest point of the transient, locked on reference. Deviations in thickness of sample correspond to changes in electrical length of the propagating beam path.

The X-band system was used to render measurements of $\frac{1}{1000}^{th}$ of the driving source wavelength. The high degree of NLTL phase sensitivity was exploited to track femtosecond propagation delay times. Measurements were repeatable and precise across the 500 measurements made. Data matched prediction with complete agreement for three samples. Sample flaw yielded consistent error for one sample. Submicron measurement feasibility was demonstrated. Measurement acuity was increased by faster transients, and sub-picosecond transients enabled observation of sub-micron features.

This technique is applicable to, for example, manufacturing process control.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

REFERENCES

The following references, some of which are cited above, are each incorporated herein by reference in its entirety

[1] J. Breitbarth, "Design and Characterization of Low Phase Noise Microwave Circuits," University of Colorado, 2006.
[2] M. Dwyer, H. Kim, L. Mawst, and D. van der Weide, "Double-uniform Schottky diode nonlinear transmission line generating sub-picosecond transients," in 2018 IEEE Radio and Wireless Symposium (RWS), 2018, pp. 287-289.
[3] S. R. Kurtz, "Mixers as Phase Detectors," WJ Commun. Inc., 2001.
[4] S. Jablonski, K. Czuba, F. Ludwig, and H. Schlarb, "$2\pi$ Low Drift Phase Detector for High-Precision Measurements," IEEE Trans. Nucl. Sci., vol. 62, no. 3, pp. 1142-1148, June 2015.
[5] Hao Yan, Xiaoping Liao, and Di Hua, "The phase sensitivity and response time of an X-band dual channel microwave phase detector," in 2015 IEEE SENSORS, 2015, pp. 1-4.
[6] Skyworks, "Theory and Application of Sampling Phase Detector." pp. 1-7, 2008.
[7] Holzworth Instrumentation, "MODEL HX3400 Datasheet." 2018. [8] Analog Devices, "HMC3716LP4E Datasheet." 2018.

The invention claimed is:

1. A phase detector device comprising:
  (a) a reference source configured to produce a first input sinusoidal waveform;
  (b) a first nonlinear transmission line (NLTL) operably connected to the reference source and configured to distort the first input sinusoidal waveform to produce a first distorted waveform comprising an edge with greater slew rate than the first input sinusoidal waveform;
  (c) a sample source configured to produce a second input sinusoidal waveform;
  (d) a second NLTL operably connected to the sample source and configured to distort the second input sinusoidal waveform to produce a second distorted waveform comprising an edge with greater slew rate than the second input sinusoidal waveform;
  (e) a sampler operably linked to the first NLTL and the second NLTL and configured to receive the first and second distorted waveforms and to produce and output that is indicative of the relative difference or error between phases of the reference source and the sample source.

2. The phase detector device of claim 1, wherein the first NLTL comprises a variable delay or phase line.

3. The phase detector device of claim 1, wherein the first NLTL and second NLTL are substantially similar.

4. The phase detector device of claim 1, wherein the sample source is an unknown source.

5. The phase detector device of claim 1, wherein the first and second distorted waveforms are sawtooth or step-like waveforms with regions having enhanced slew rates.

6. The phase detector device of claim 1, further comprising a conventional sampling gate or switch, driven by the first input sinusoidal waveform, to sample a voltage of the second input sinusoidal waveform.

7. The phase detector device of claim 1, further comprising a conventional sampling gate or switch, driven by the first distorted waveform, to sample a voltage of the second distorted waveform.

8. The phase detector device of claim 7, wherein the first and second distorted waveforms have a rising and/or falling edge with a maximum slope of greater than 10V/ns.

9. The phase detector device of claim 8, wherein the first and second distorted waveforms have a rising and/or falling edge with a maximum slope of greater than 100V/ns.

10. The phase detector device of claim 9, wherein the first and second distorted waveforms have a rising and/or falling edge with a maximum slope of greater than 1V/ps.

11. A method comprising:
  (a) applying a first nonlinearity to a first input sinusoidal waveform from a reference source to obtain a first distorted waveform comprising an edge with greater slew rate than the first input sinusoidal waveform;
  (b) applying a second nonlinearity to a second input sinusoidal waveform from a sample source to obtain a second distorted waveform comprising an edge with greater slew rate than the second input sinusoidal waveform;
  (c) feeding the first and second distorted waveforms into a sampler to produce an output that is indicative of the relative difference or error between phases of the reference source and the sample source.

12. The method of claim 11, wherein the first and second distorted waveforms are sawtooth or step-like waveforms with regions having enhanced slew rates.

13. The method of claim 12, wherein the first and second distorted waveforms have a rising and/or falling edge with a maximum slope of greater than 10V/ns.

14. The method of claim 13, wherein the first and second distorted waveforms have a rising and/or falling edge with a maximum slope of greater than 100V/ns.

15. The method of claim 14, wherein the first and second distorted waveforms have a rising and/or falling edge with a maximum slope of greater than 1V/ps.

* * * * *